United States Patent [19]

Strobele

[11] 4,200,889
[45] Apr. 29, 1980

[54] COMPLEMENTARY PRE-EMPHASIS AND DE-EMPHASIS CIRCUITS FOR A VIDEO SIGNAL TRANSFER CHANNEL

[75] Inventor: Caljon H. Strobele, Santa Ana, Calif.

[73] Assignee: BASF Aktiengesellschaft, Ludwigshafen, Fed. Rep. of Germany

[21] Appl. No.: 754,757

[22] Filed: Dec. 27, 1976

[51] Int. Cl.² .............................................. H04N 9/53
[52] U.S. Cl. ..................................... 358/167; 455/63; 333/14; 360/65; 360/33
[58] Field of Search ............... 358/21, 24, 136, 138, 358/160, 167; 325/46, 65; 360/25, 30, 33, 39, 65; 179/1 P, 1 D; 235/150.51; 238/127; 333/14, 19, 28; 332/18, 37 R, 37 D; 330/31, 157, 175, 192; 307/233

[56] References Cited

U.S. PATENT DOCUMENTS

| | | | |
|---|---|---|---|
| 3,111,635 | 11/1963 | Skov et al. | 325/46 |
| 3,117,278 | 1/1964 | Johnson | 360/65 |
| 3,193,771 | 7/1965 | Boatwright | 325/46 |
| 3,350,512 | 10/1967 | Percival et al. | 333/14 |
| 3,641,468 | 2/1972 | Hodder | 325/46 |
| 3,902,131 | 8/1975 | Dorren | 333/14 |
| 3,970,968 | 7/1976 | Sly | 332/37 D |
| 3,972,010 | 7/1976 | Dolby | 333/14 |
| 4,000,369 | 12/1976 | Paul, Jr. et al. | 179/1 P |

*Primary Examiner*—Benedict V. Safourek
*Attorney, Agent, or Firm*—Keil & Witherspoon

[57] ABSTRACT

Complementary circuits for pre-emphasis and de-emphasis of video luminance signals, the circuits permitting an improved signal-to-noise ratio in a video signal transfer channel. The video signal has separate frequency- and amplitude-sensitive portions as well as a linear gain portion, thereby providing a fixed gain up to a predetermined lower frequency, a fixed response between this frequency and a variable upper frequency breakpoint, and an amplitude-dependent gain above the upper frequency breakpoint. De-emphasis is performed by a circuit also having separate frequency- and amplitude-sensitive portions and a linear gain portion, and which may be readily matched to the pre-emphasis circuit.

22 Claims, 10 Drawing Figures

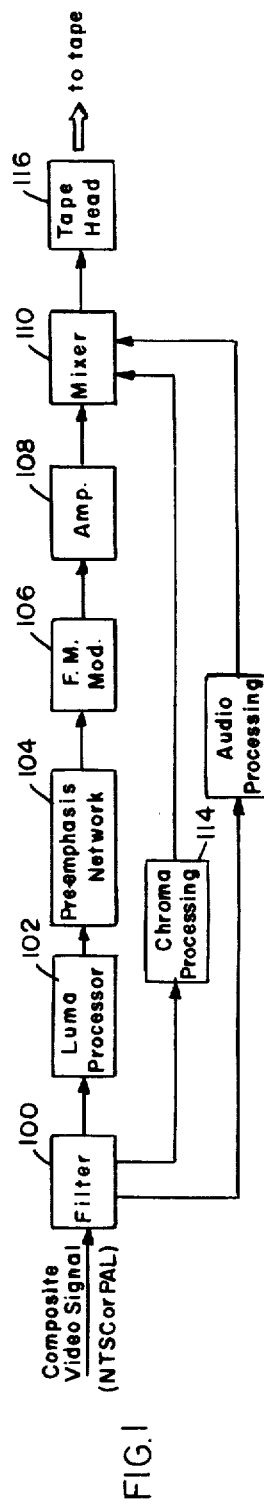
FIG. 1 Block diagram, F.M. Record
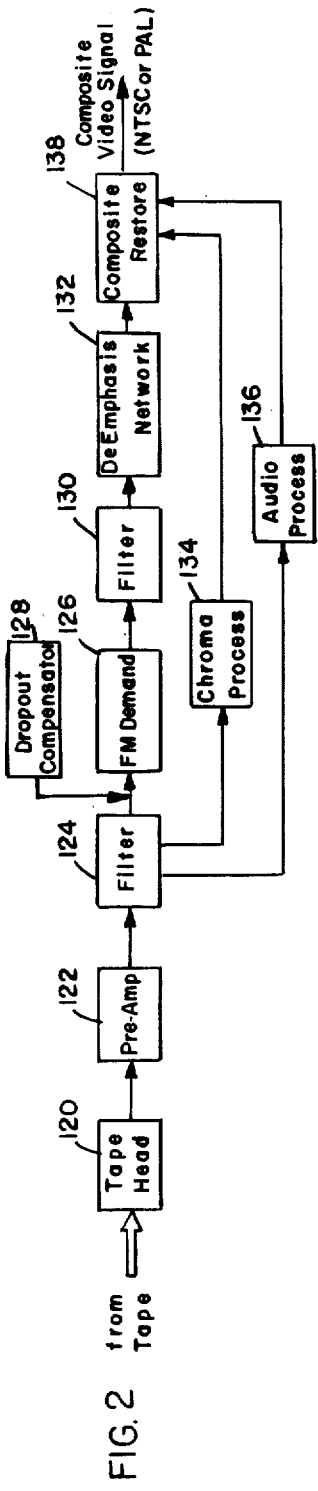
FIG. 2 Block diagram, F.M. Playback
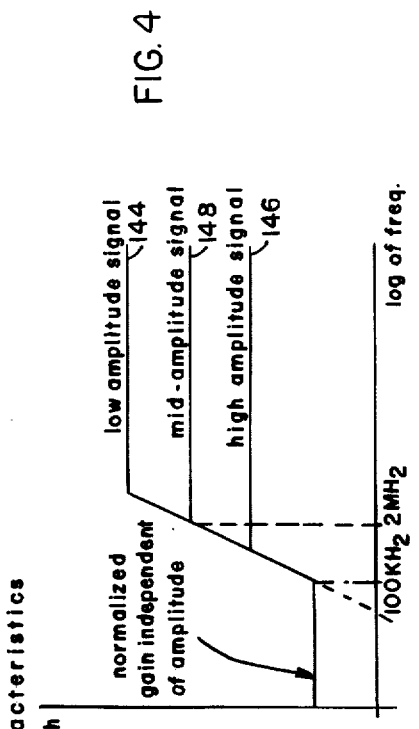
FIG. 4 Present Invention Gain/Freq. Characteristic
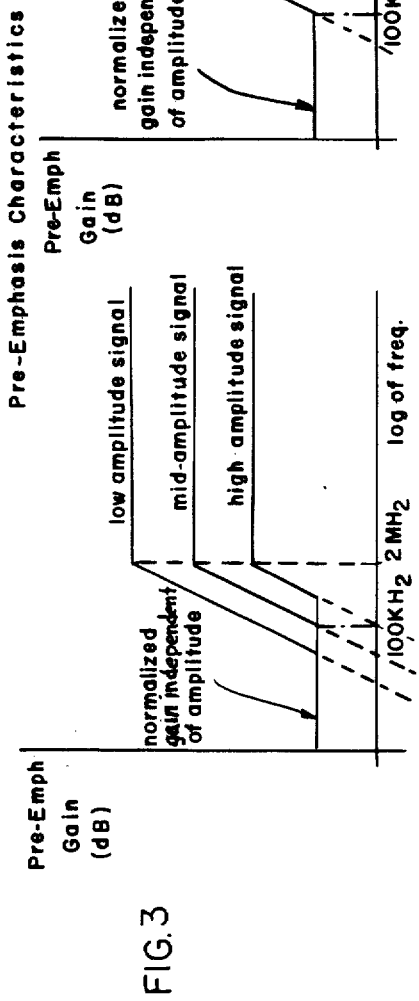
FIG. 3 Prior Art Gain/Freq. Characteristic (Winston)

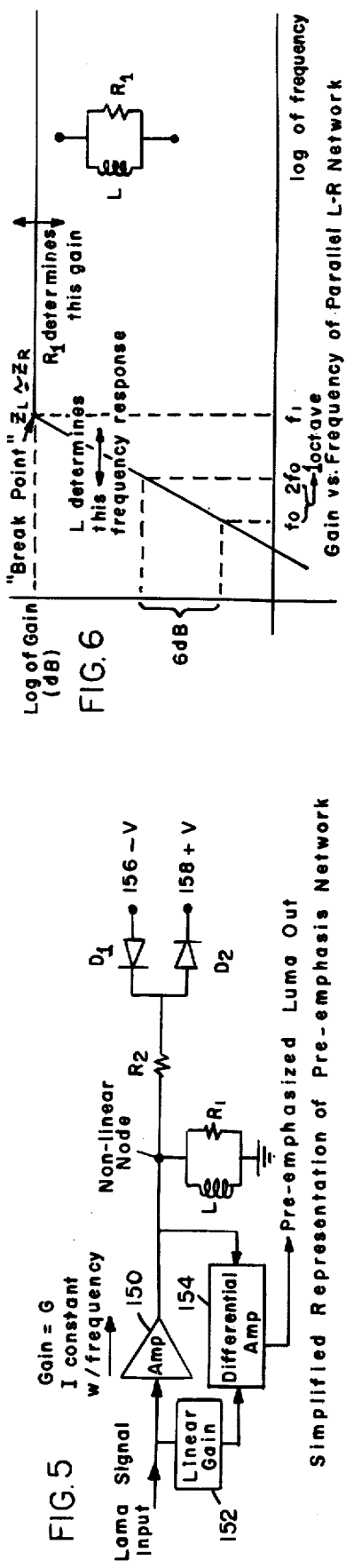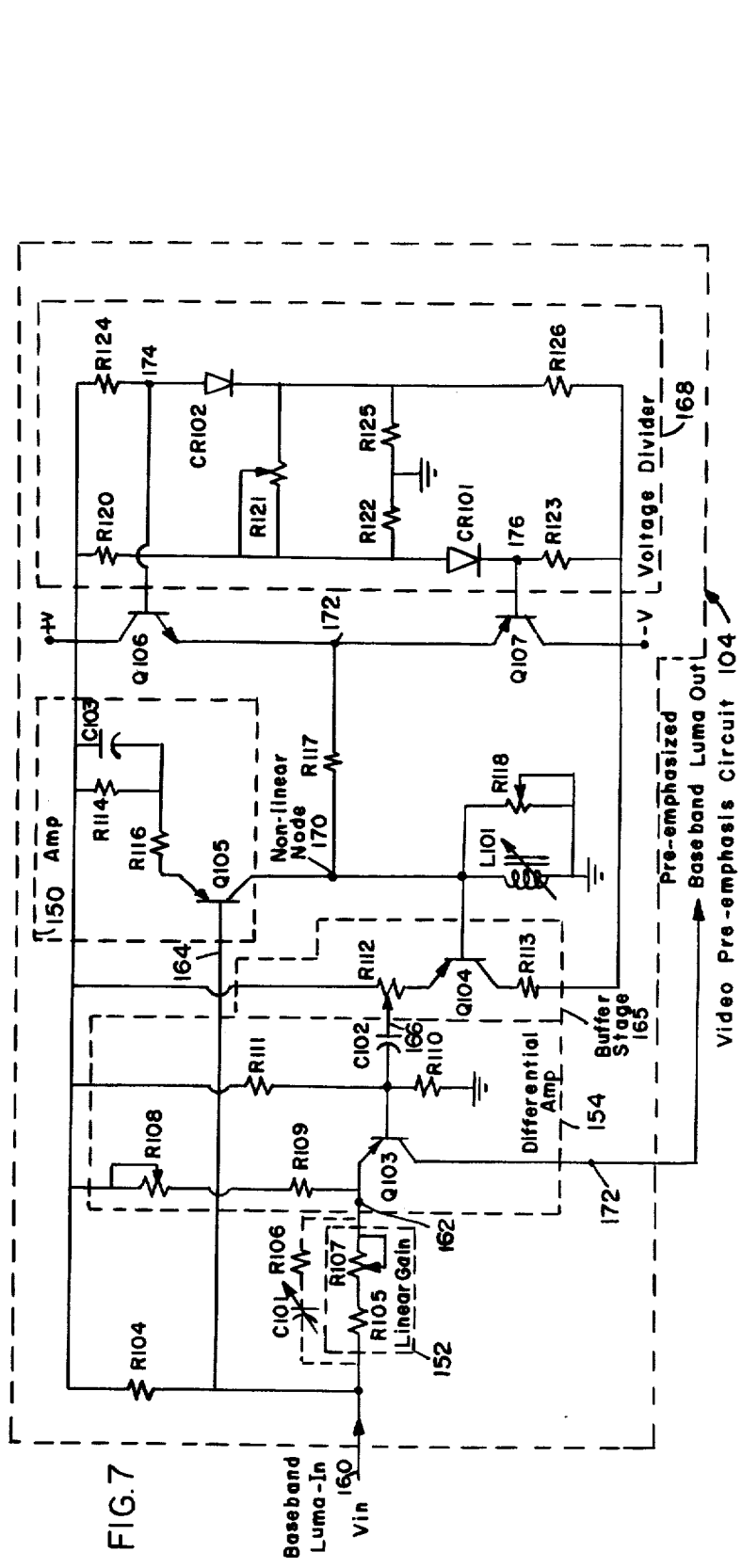

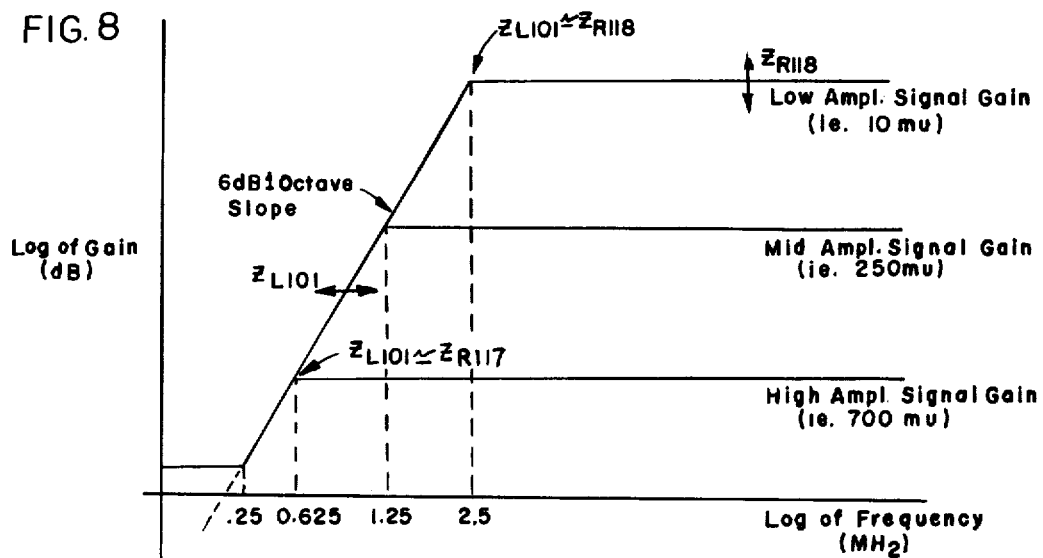
Gain vs. Frequency Response of Pre-Emphasis Network
Typical Values Shown
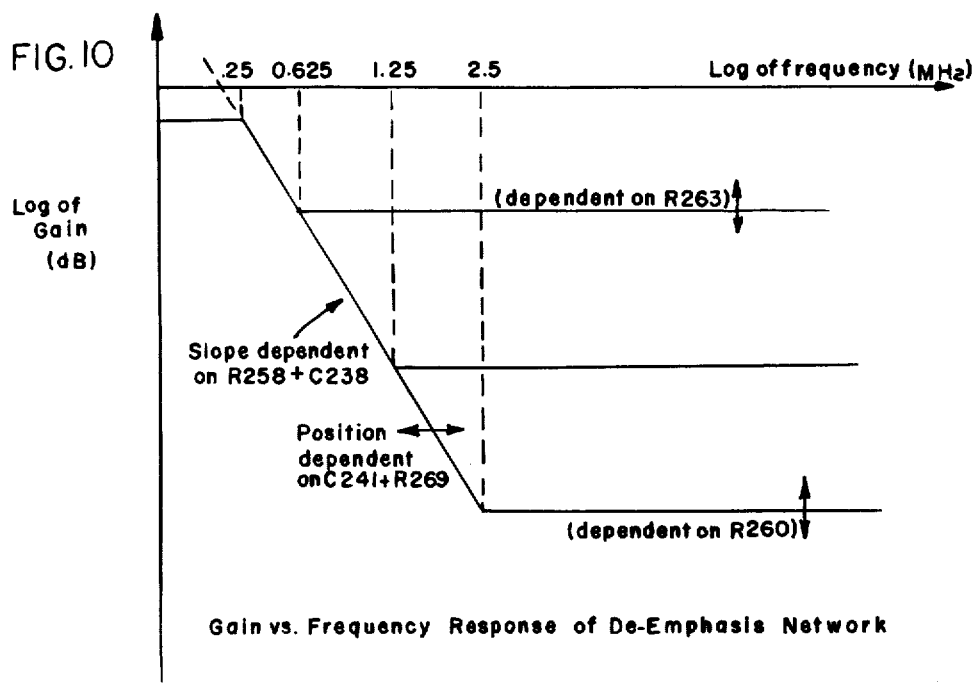
Gain vs. Frequency Response of De-Emphasis Network

COMPLEMENTARY PRE-EMPHASIS AND DE-EMPHASIS CIRCUITS FOR A VIDEO SIGNAL TRANSFER CHANNEL

BACKGROUND OF THE INVENTION

1. Field of the Invention

The invention relates to improvements in matched pre-emphasis and de-emphasis circuits for broad-band signals, particularly video signals, intended to be passed through a television signal transfer channel.

2. The Prior Art

Pre-emphasis and de-emphasis circuits are known for improving the signal-to-noise ratio in wide band signal transfer circuits. For example, U.S. Pat. No. 3,288,930, issued Nov. 29, 1966, describes circuits for pre-emphasis and de-emphasis of video signals. These circuits utilize diodes in a non-linear frequency-disciminating portion thereof for attenuating or accentuating the amplitudes of high-frequency, high-amplitude signals. Although the circuits disclosed in U.S. Pat. No. 3,288,930 are somewhat effective for the intended purpose of improving the signal-to-noise ratio in the overall system, there are some disadvantages of such circuits which result in a less than desirable overall frequency-response characteristic. The frequency response characteristic given in FIG. 7 of the U.S. Pat. No. 3,288,930 shows that the circuit is both frequency and amplitude sensitive, such that lower frequency signals are subjected to a substantially constant gain, while relatively higher frequency signals are subjected to a gain which is inversely related to input signal amplitude.

Although the circuit of the U.S. Pat. No. 3,288,930 serves its purpose reasonable well, it has been found that the lower break-point frequency of the frequency-response characteristics (i.e. at about 100-500 KHz in the U.S. Pat. No. 3,288,930 FIG. 7) is variable with signal amplitude.

Since the break-point of the frequency-response characteristic of the pre-emphasis circuit of the U.S. Pat. No. 3,288,930 changes with the signal level, it is necessary to provide a de-emphasis circuit which is very closely matched to the characteristic of the pre-emphasis circuit. This of course necessitates careful matching of components so that the time-constant, and hence the lower break-point frequency, of the de-emphasis circuit is as close as possible to the time-constant (and lower breakpoint frequency) of the pre-emphasis circuit.

SUMMARY OF THE INVENTION

It is accordingly an object of the present invention to provide matched pre-emphasis and de-emphasis circuits which provide a relatively flat overall frequency-response characteristic.

It is a further object of the invention to provide pre-emphasis and de-emphasis circuits which have complementary response characteristics and which provide a relatively flat overall frequency-response characteristic without requiring careful matching of high tolerance components or of the time constants of the respective circuits.

It is still a further object of the present invention to provide a pre-emphasis circuit which has a constant lower frequency breakpoint so as to minimize the need for careful matching of components in the de-emphasis circuit with the pre-emphasis circuit, yet having the pre-emphasis circuit both amplitude and frequency sensitive so that signals above a predetermined frequency will be provided with a degree of pre-emphasis gain which is inversely related to the signal level.

The present invention comprises both pre-emphasis and de-emphasis circuits for use in a television signal transfer channel, such as a video tape recorder. The circuit is designed to provide the video signal with a gain which is relatively constant with signal amplitude below a predetermined lower "breakpoint" frequency and which is inversely proportional to the signal level above the predetermined lower breakpoint frequency. The pre-emphasis circuit is designed so that the predetermined lower breakpoint frequency does not change in dependence on signal level. Since this breakpoint frequency is substantially constant, it permits use of a de-emphasis circuit having components of relatively lower tolerance than would otherwise be required.

The complementary function of the pre-emphasis circuit is attained by means of a de-emphasis circuit which has parallel networks for providing linear and non-linear gain characteristics to the off-tape video signal. Addition of the signals from the linear and non-linear segments of the de-emphasis circuit, along with subsequent roll-off of the signal, results in a completely restored video signal without substantial distortion.

The pre-emphasis and de-emphasis circuits of the present invention avoid the problems of matching the characteristics of discrete diodes, which is a necessity for production of the pre-emphasis and de-emphasis circuits utilizing such diodes as shown in the U.S. Pat. No. 3,288,930 noted above. The present invention furthermore avoids the necessity for providing a de-emphasis circuit having a frequency-response characteristic in the vicinity of the lower breakpoint which is matched to the pre-emphasis circuit.

Those skilled in the art will recognize from the detailed description of the preferred embodiments described below that the result is a system which is highly effective for improving the signal-to-noise ratio in a television signal transfer channel, such as a video tape recorder, the system having a substantially flat frequency response and being easily fabricated from relatively low tolerance components. There is no need for matching the characteristics of discrete diodes or of other components, and the capacitive components of the diode transfer characteristics do not present any significant problems with respect to providing a relatively flat overall system frequency response characteristic.

BRIEF DESCRIPTION OF THE DRAWINGS

FIG. 1 shows in block diagram form the video signal processing circuitry for the record mode of a video tape recorder;

FIG. 2 shows in block form the video signal processing circuitry for the playback mode of a video tape recorder;

FIGS. 3 and 4 show the gain vs. frequency characteristics of a prior art pre-emphasis circuit and of the pre-emphasis circuit of the present invention, respectively;

FIG. 5 shows a simplified diagram of the pre-emphasis circuit according to the present invention;

FIG. 6 shows a plot illustrating the relationship between gain and frequency for a parallel L-R circuit;

FIG. 7 shows a schematic diagram of a pre-emphasis circuit according to the present invention;

FIG. 8 shows the gain vs. frequency characteristic of the circuit of FIG. 7;

FIG. 10 shows the gain vs. frequency characteristic of the circuit of FIG. 9.

DETAILED DESCRIPTION OF THE PREFERRED EMBODIMENTS

Figure 9:
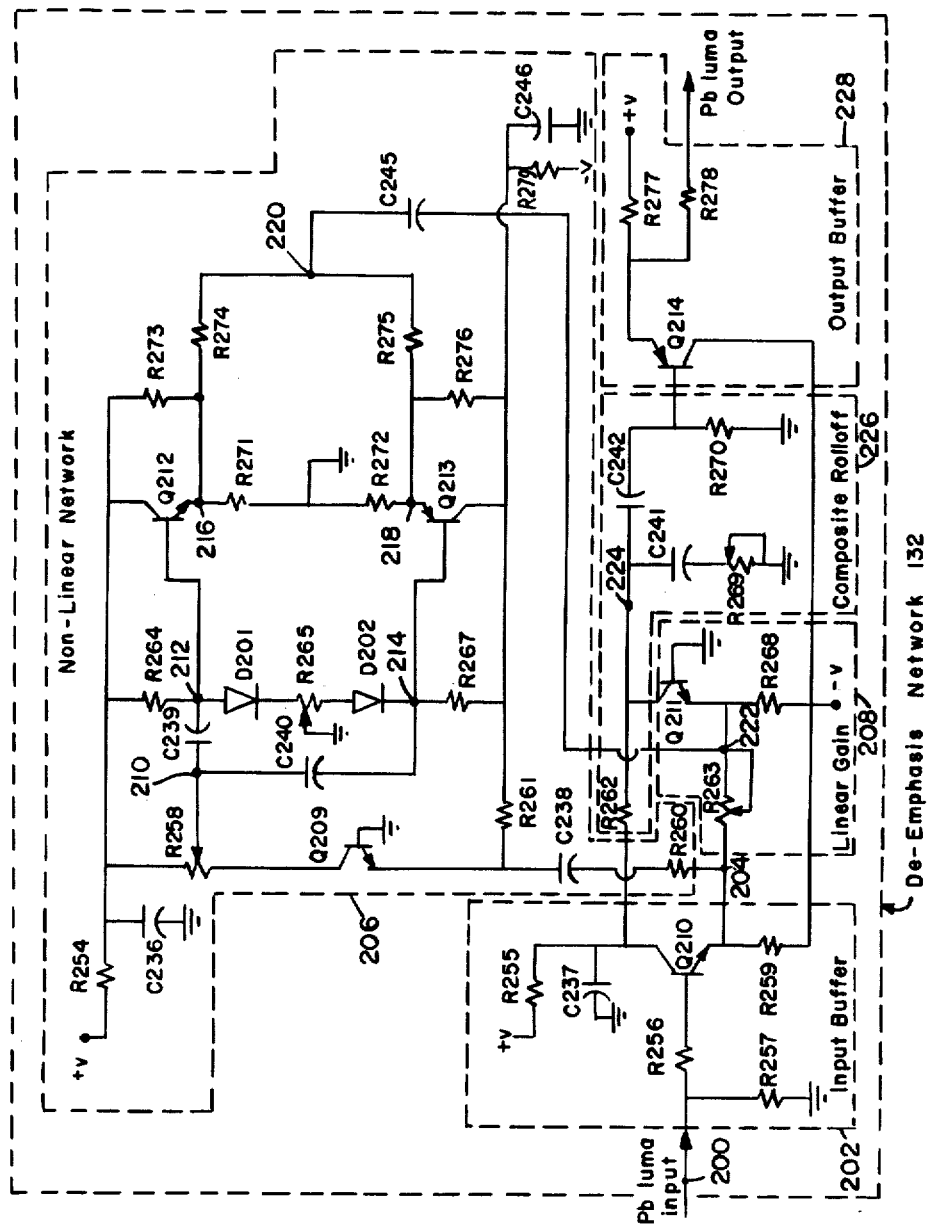
FIG. 9 shows a schematic diagram of a de-emphasis circuit according to the present invention.

FIG. 1 shows in block diagram form the video signal processing circuitry for the record mode of a video tape recorder. A conventional NTSC (or PAL) composite video signal is separated by a filter 100 into its respective audio, chrominance (chroma) and luminance (luma) components in a known manner. The luma signal is then processed by circuitry 102 in a conventional manner, being reduced to base-band and amplified and filtered, for example. The luma signal is then treated by the pre-emphasis network 104 of the present invention prior to being modulated by FM modulator 106, for example. The modulated video signal is amplified by Amplifier 108 and supplied to mixer 110. The audio and chroma signals are processed by appropriate circuits 112,114, respectively, and supplied to mixer 110. Mixer 110 then passes the composite video signal to recording head 116 for recording on tape. The audio and chrominance signals may be processed in any conventional fashion and, for this reason, the processing circuitry for these signals is shown only in block form.

FIG. 2 shows a system in a block diagram form for processing the composite video signal received from tape. The signal from tape is picked up by a tape head 120, is amplified by pre-amp 122 and is separated into its respective luma, chroma, and audio components by a conventional filter circuit 124. For use in a video tape recorder, it is desirable to include a dropout compensator circuit 128 of a type known in the art. A typical dropout compensator supplies an RF signal similar to the picture content, such as a delayed horizontal line of video information. The separated luma signal is then reduced to baseband by an FM demodulator 126 and the video signal is again filtered in filter 130 as is conventional.

The video signal is then processed by a de-emphasis network 132 having a gain vs. frequency characteristic complementary to that of the noise reducing pre-emphasis network 104 of FIG. 1, and is restored thereby to its original frequency-amplitude characteristic. The chroma and audio signals from filter 124 are processed in known fashion by circuits 134,136, respectively, and supplied to a circuit 138 which restores the composite video signal to desired format, such as NTSC or PAL, as known in the art. For simplicity, the luma processing circuitry is shown as circuit blocks 130,132. However, it will be understood that such circuitry includes, for example, an FM limiter, doubler, a pulser for providing a pulse at each zero crossing of the signal, and means for clamping the "back porch" of each horizontal line to a predetermined level.

Noise energy in a wide-band signal transfer channel, such as that described broadly above with reference to FIGS. 1 and 2, is typically not localized in a specific frequency range but instead extends over substantially the entire wide-band spectrum. The wide-band signal, however, does not have a flat spectrum and as a result the signal-to-noise ratio (S/N) for the higher frequency components of the wide band signal is significantly lower than for the lower frequency components of such signal. In the case of a video signal, this will result in a noisy picture display on the television screen unless corrective measures are taken.

Pre-emphasis and de-emphasis circuitry acts to improve the S/N at higher frequencies by increasing the amplitude of higher frequency signal components relative to lower frequency signal components prior to introduction of the signal into the noise-producing transfer channel. In this way, the frequency response of the signal recording system of FIG. 1 is intentionally distorted. On playback of the distorted signal, the signal off tape comprises the video signal after pre-emphasis plus the noise signal. The composite video signal having pre-emphasis and noise is reduced in gain by a value roughly equal to the pre-emphasis level, thereby restoring substantially the levels of the original video signal. The result is a normal frequency response signal having tape channel noise suppressed.

In order to optimize the signal-to-noise ratio without inducing non-linearities due to over-driving of the transfer channel, the pre-emphasis may be made dependent upon the signal amplitude. If the signal amplitude is small, a large pre-emphasis is supplied, while if the signal amplitude is large, a small pre-emphasis is called for. Even when a small amplitude signal is subjected to a relatively large pre-emphasis, the signal amplitude after pre-emphasis is maintained at a level which is small enough with respect to the carrier amplitude so that no distortion results. For large amplitude signals, maintaining the pre-emphasis at a low level prevents over-modulating the carrier or overdriving the transfer channel with too large a signal amplitude.

The effect of the pre-emphasis is, then, to maintain the sideband energy within a limited range relative to the carrier. If the sideband energy is too low, the signal is lost upon playback. If the sideband energy is too high, the FM demodulator confuses the sideband with the carrier frequency and begins to demodulate the FM signal off tape as if the sideband frequency is the carrier frequency and vice versa. This inherent limitation on FM demodulation adds to the desireability of a pre-emphasis circuit which, as in the present invention, has gain that is both frequency and amplitude dependent.

In normal video picture the noise is most noticeable to the viewer where there is little detailed information on the screen, such as when a picture of a clear blue sky is presented on the TV screen. In this situation, the higher frequency signal components are at a low level and a large pre-emphasis is needed to increase the S/N to such a level as to produce the desired clear blue picture. However, when the television screen has much detailed information on it, such as numerous lines, a human face, or the like, the pre-emphasis can be reduced because the higher frequency signal components are at a relatively high level and the noise is generally not as noticeable to the viewer.

With this in mind, it is helpful to compare the gain vs. frequency response characteristic of the present invention with that of the aforementioned prior art, U.S. Pat. No. 3,288,930. FIG. 3 illustrates a typical frequency-response characteristic for a pre-emphasis circuit of the type disclosed in the U.S. Pat. No. 3,288,930. As can be seen from FIG. 3, a large gain is applied to small amplitude, high frequency signals, while smaller gain is applied to large amplitude, high-frequency signals. The low frequency signal gain is substantially unaffected by signal level. The concept is to apply as much high frequency gain to the signal as possible without overloading the transfer channel.

Some pre-emphasis schemes, such as that described in U.S. Pat. No. 3,288,930, will take a band of frequencies at the high frequency end and increase or decrease the amplitude in dependence on the amplitude of the band. All frequencies above some given frequency level are moved according to the average band amplitude. The implementation of this technique in the U.S. Pat. No. 3,288,930. circuit has the disadvantage that the low-frequency breakpoint of the frequency characteristic, as shown in FIG. 3, also varies according to the signal level. For low amplitude signals, the low frequency breakpoint will occur, for example, below 100 KHz. But for high amplitude signals, the pre-emphasis low frequency breakpoint will occur at a level above 100 KHz. For some intermediate signal level the breakpoint will be at 100 KHz.

Although the gain vs. frequency characteristic of FIG. 3 is acceptable if the de-emphasis circuit provides complementary adjustment to the signal after retrieval from the tape channel, it is to be noted that matching of the pre-emphasis and de-emphasis time constants at relatively low frequencies (in the vicinity of 100 KHz, for example) can be difficult as well as costly. It may be necessary to carefully match high tolerance components to obtain a net flat response characteristic. For this reason, it is preferable to provide a pre-emphasis circuit which maintains the lower frequency breakpoint at a fixed frequency and which has breakpoint frequency variation, if any, at the "upper" breakpoint, for example around 2 MHz.

It has been found by the present inventor that this objective can be attained by using diodes as switching elements rather than as non-linear, voltage-sensitive resistors as in the circuits of U.S. Pat. No. 3,288,930. By this means, the variations in pre-emphasis gain occur at frequencies well above the lower frequency breakpoint, as shown in FIG. 4, which shows the frequency characteristic of the pre-emphasis circuit of the present invention.

Comparing FIG. 4 with FIG. 3, it can be seen that the low frequency gain characteristics of both FIGS. 3 and 4 are substantially unaffected by signal level and that the pre-emphasis gain for the upper frequencies in the band is dependent on the input signal level. However, it can be seen that in the FIG. 4 characteristic the lower frequency breakpoint is constant with input signal amplitude and the roll-off is constant (typically 6 dB/octave), only the upper frequency breakpoint being variable with signal amplitude. It is well known in the art that the time constants of complementary circuits are less difficult to match at higher frequencies and that component tolerances for matching the de-emphasis frequency characteristic to the pre-emphasis frequency characteristic may be much less rigid. The present invention, which will be described in more detail below, has the frequency characteristic shown in FIG. 4.

FIG. 5 is a simplified diagram of a pre-emphasis network 104 according to the present invention. The luma signal from processor 102 (FIG. 1) is supplied to the input of an inverting amplifier 150 having gain G, as well as to the input of a linear gain component 152. The outputs of linear gain component 152 and amplifier 150 are connected to respective inputs of a differential amplifier 154. The output of inverting amplifier 150 is further connected to a load, an inductor L and a resistor $R_1$ connected in parallel, as well as being connected in parallel with a pair of back-to-back diodes D1, D2 through resistor R2. The remaining terminal of each diode D1, D2 is connected to voltage sources maintained at $+V$ and $-V$, respectively. The luma signal received at the input of amplifier 150 is pre-emphasized according to the frequency characteristic of the circuit (shown in FIG. 4), and taken off the output of differential amplifier 154.

The operation of the circuit of FIG. 5 is as follows. When the signal amplitude is small, diodes D1, D2 act as open circuits and the remainder of the pre-emphasis circuit acts like an L-R circuit giving a gain vs. frequency characteristic as shown in FIG. 6. Referring now to FIG. 6, it can be seen that the parallel L-R network provides a signal response of 6 dB/octave up to the frequency at which the impedance of the inductor $Z_L$ roughly equals the impedance of the resistor $Z_{R1}$. The value of L determines the gain of the 6 dB/octave slope portion, while the value of R1 relative to L determines the frequency at which the upper break point will occur. It can be seen that for lower frequency signals, inductor L will be substantially a short circuit to ground and the output of differential amplifier 154 will be just the input luma signal subjected to a linear gain by component 152.

The sum of the characteristics produced by this network when diodes D1, D2 are open circuited results in the gain vs. frequency characteristic of FIG. 4 for a low-amplitude signal. That is, when the diodes are reverse biased, or off, the network will subject the upper frequencies of the incoming video signal to maximum gain as represented by "shelf" 144.

Diodes D1, D2 are biased by a temperature compensated network such that as the signal amplitude at the amplifier output becomes greater than a predetermined voltage, the diodes switch on, thereby causing the gain for high frequency signals to decrease by paralleling resistor R2 with the L-R1 network. Shelf 146 of FIG. 4 represents the pre-emphasis gain for high frequency, high amplitude signals.

The circuit of FIG. 5 will of course produce an infinite number of intermediate level shelves 148 in the gain vs. frequency characteristic of FIG. 4 for the upper frequencies of intermediate level video signals. It will be understood that the shelf 146 corresponds to an input signal of sufficient amplitude to forward bias diodes D1, D2, thereby causing peaks of the signal which exceed a predetermined level to be attenuated. This predetermined level is determined by the bias voltages at terminals 156,158, and the voltage drop across the diode junctions of D1, D2. For example, if terminals 156, 158 are maintained at $+1.3$, $-1.3$ volts, respectively, and the diode junction voltage of D1,D2 is 0.7 volt, the maximum peak-to-peak voltage of the signal at the "non-linear node" will be 1.2 volts. Peaks exceeding $+0.6$, $-0.6$ volt will be attenuated, resulting in a gain which is amplitude dependent. A more detailed discussion follows below with reference to the pre-emphasis circuit diagram of FIG. 7. In practice, diodes D1, D2 are preferably replaced with transistor switches as will be described with reference to FIG. 7.

A very significant difference between the present invention and the pre-emphasis circuitry described in U.S. Pat. No. 3,288,930 is that the circuit of the U.S. Pat. No. 3,288,930 has a signal attenuating network comprising back-to-back diodes acting as a voltage-sensitive variable resistor, the diodes being in series with frequency-sensitive components such as capacitors. Since the signal attentuating portion of the U.S. Pat. No. 3,288,930 circuit comprises a signal network which is both frequency and amplitude sensitive, the frequency value at which the change in pre-emphasis will occur is not easily predictable. This is due in part to the variable resistive component of the diode transfer characteristics.

In contrast to the U.S. Pat. No. 3,288,930 circuit, the pre-emphasis circuit of the present invention utilizes a frequency-sensitive (L-R) network tied to an amplitude-sensitive (diode junction) network, so that the frequency at which the change in pre-emphasis occurs may be more easily predicted. This makes the matching of pre-emphasis and de-emphasis circuits less troublesome and less costly than in the prior art device of the U.S. Pat. No. 3,288,930.

FIG. 7 shows in greater detail than FIG. 5 a circuit according to the present invention for effecting non-linear pre-emphasis of video signals. The luma signal from processor 102 (FIG. 1) is received at an input terminal 160 and passes through linear gain component 152, which comprises a fixed resistor R105 and a variable resistor R107, to an input 162 of differential amplifier 154. The input luma signal is also sent to amplifier 150 and passes, with a gain G to be explained more fully below, through buffer stage 165 to input 166 of differential amp 154. A reactive network comprising inductor L101 and resistor R118 (comparable to network L-R1 of FIG. 5) is connected from non-linear node 170 to ground.

Resistor R117 connects node 170 to the junction 172 of the emitters of transistors Q106,Q107. The transistors Q106, Q107 may be of any inexpensive, low beta type. Resistor R117 compares with R2 and transistors Q106, Q107 compare with diodes D1, D2 of FIG. 5. The collectors of Q106, Q107 are held at supply voltage levels +V, −V, respectively, while the bases of Q106, Q107 are biased by a voltage divider network 168.

Divider network 168 provides temperature-compensation as well as the necessary biasing voltages and comprises resistors R120–R126 and diodes CR101 and CR102. By utilizing the diode junctions of CR101, CR102 in voltage divider 168, variations in voltage drop across the base-emitter junctions of Q106 and Q107 may be offset so as to maintain substantially constant circuit operation with varying temperature. It can be seen that as the voltage at terminal 174 (the base of Q106) is dependent on the diode junction voltage drop across CR102, a temperature change which causes a change in the voltage drop across the base-emitter junction of Q106 will cause a similar change in the CR102 voltage drop. The voltage at 174 will thereby be compensated. For example, if the voltage at 174 is +1.3 volts when the CR102 and Q106 junction drops are at 0.7 volts, the voltage at 174 will be adjusted to +1.2 volt when the drops across CR102 and Q106 are at 0.6 volt. The peak positive voltage at node 172 will thus be +0.6 volt regardless of temperature. A similar result obtains for CR101 and Q107. In addition, the use of variable resistor R121 allows the bias voltages to the bases of Q106,Q107 to be set at symmetrical values of opposite polarity, for example at +1.3 volt and −1.3 volt, respectively.

Transistor Q105 comprises an amplifier 150 having constant current with frequency, the gain G changing with signal amplitude. When the signal amplitude at node 170 is smaller than that needed to forward bias the base-emitter junctions of Q106,Q107, the gain of Q105 is approximated by the net impedance of R118 paralleled with L101, divided by the impedance of R116. That is to say:

$$G_{Q105} = -Z(R118 \| L101)/Z(R116)$$

When the signal amplitude is sufficient to forward bias Q106, Q107, the gain of Q105 is given by $$G_{Q105} = -Z(R117 \| R118 \| L101)/Z(R116)$$

As shown in FIG. 8, the value of L101 determines the frequency at which the 6 dB/octave gain equals the low frequency gain, while the value of R118 determines the frequency at which the upper break point occurs for low amplitude signals. With Q106, Q107 reverse biased, the upper break point frequency occurs when $Z_{R118} \approx Z_{L101}$ and the lower break point is when the gain of network 152 equals $G_{Q105}$. But with Q106, Q107 forward biased, the upper break point frequency occurs when $Z_{(R118 \| R117)} \approx Z_{L101}$. However, the gain of Q105 is so low at the lower break point forward biasing of Q106, Q107 cannot occur with normal video input signals. A conventional video signal may have, for example, a maximum peak-to-peak luminance voltage of 700 mv in a "high" amplitude passage, and a minimum peak-to-peak voltage of around 10 mv in a "low" amplitude passage. An "intermediate" level signal would fall between these limits. FIG. 8 shows the relative gain provided by the circuit of FIG. 7 for these typical values.

Resistor R116 controls the A.C. current to node 170 and sets the voltage level appearing at the emitters of Q106, Q107. This in turn sets the input signal level at which R117 is paralleled with R118 for reducing the gain of Q105. Resistor R117 is relatively small and acts to prevent hard clipping of signal peaks. It can be seen that as R117 is reduced in value, the gain of Q105 for high amplitude signals is reduced. At zero value for R117 hard clipping occurs. Hard clipping is undesirable since it causes signal information to be lost which could otherwise be used to restore the original undistorted wide band signal in the de-emphasis portion of the transfer channel.

The signal from non-linear node 170 is received by buffer stage 165, which comprises transistor Q104 and a gain control R112, and supplies the non-linear portion of the luma signal to input 166 of differential amplifier 154.

Amplifier 154 comprises transistor Q103, DC biased by resistors R108-R111. Gain network 152, comprising resistors R105,R107 supplies the incoming luma signal Vin to input 162 of amplifier 154 with a predetermined linear gain. The linear portion of the output current at 172, $i_{172}$, is simply:

$$i_{172} = Vin/(R_{105} = R_{107})$$

The non-linear signal from Q104 is added to this by amplifier 154 to give the complete pre-emphasized output signal at 172.

One further item of note is that resistor R106 in series with capacitor C101, shown in dashed lines, may be added to provide compensation for the frequency response of the FM modulator 106 of FIG. 1. While not strictly necessary to accomplish pre-emphasis, this compensation network is desireable in a practical circuit.

After the luma signal has been pre-emphasized and modulated, it is amplified, mixed with the chroma and audio signals and recorded, as shown in FIG. 1. The luma signal retrieved from tape upon playback is separated from the chroma and audio signals, demodulated, filtered and de-emphasized in a manner complementary to the above-described pre-emphasis, prior to being used to restore the composite NTSC or PAL video signal, as shown in FIG. 2. A schematic diagram of de-emphasis network 132 is shown in FIG. 9, which will now be described in detail.

The pre-emphasized luma signal enters de-emphasis circuit 132 at input 200. An input buffer 202 comprising transistor Q210 then transfers the luminance signal with linear gain to node 204. Both a non-linear network 206 and a linear gain stage 208 receive the luma signal from node 204. The non-linear stage has at its input a resistor R260 and a capacitor C238 in series, for passing the upper frequencies of the luma signal through grounded-base transistor Q209 and resistor R258 to node 210. The time constant of series-connected R258 and C238 determines the response of the circuit transfer characteristic and the value of R260 determines the high frequency shelf of the characteristic of the network 206.

The purpose of non-linear network 260 is to restore the peaks of high-amplitude signals which were attenuated during pre-emphasis by action of transistors Q106, Q107. This is accomplished as follows. A voltage divider network comprising resistors R264, R265 and R267, as well as diodes D201 and D202, maintain nodes 212, 214 at respective symmetrical voltages of, for example, +3, −3 volts. Diodes D201, D202 serve to compensate the D.C. bias voltages at the bases of Q212, Q213 for changes in the base-emitter junction voltage of Q212,213. The luma signal from node 210, having typically a peak-to-peak voltage of 6 volts, is passed by D.C. blocking capacitors C239,C240 to nodes 212,214. The D.C. levels of the luma signals at 212,214 are thus +3, −3 volts, respectively.

Nodes 216,218 of the non-linear network are D.C. biased at +4,−4 volts, respectively, by the voltage divider comprising resistors R271,R272, R273, R274, R275 & R276. The result of this is that only the peaks of signals at nodes 212,214 in excess of +4, −4 volts will appear at 216,218 respectively. The signal peaks from 216,218 pass through resistors R274,R275 and are combined at node 220, then passed via D.C. blocking capacitor C245 to node 222 of composite linear gain network 208.

Added at node 222 to the compressed-amplitude signal (comprising the upper luma frequencies) from non-linear network 206 is the luma signal from node 204, subjected to predetermined linear gain by resistor R263. The composite signal at 222 is then amplified by transistor Q211 and transmitted to node 224 of a composite signal roll-off network 226. This network essentially comprises R262 in parallel with the series connection of capacitor C241 and resistor R269 to A.C. ground, which provides a frequency-dependent rolloff of the composite signal complementary to that provided by the L-R network of FIG. 7 for low amplitudes. The overall response is shown graphically in FIG. 10. An output buffer 228 comprising transistor Q214 supplies the de-emphasized luminance signal to the composite signal restorer 138 of FIG. 2.

Referring once again to FIG. 10, it can be seen that the gain vs. frequency characteristic of the FIG. 9 circuit is complementary to that of the FIG. 7 circuit as depicted in FIG. 8. The value of R269 determines the lower shelf of the FIG. 10 characteristic for the higher frequency signal components, while the value of R262 determines the upper shelf. When the slope of the FIG. 10 characteristic is matched to that of the FIG. 8 characteristic by proper selection of R258 and R269, and the gain for the 6 db/octave region matched to that of the FIG. 8 characteristic by proper selection of C241, the lower frequency break points of the two characteristics are matched and will not vary with signal amplitude as with the prior art circuits. This provides the circuits of the present invention with an inherently more stable response which does not require such close matching of individual circuit components.

Although preferred embodiments of the present invention have been detailed herein, those skilled in the art will recognize that modifications may be made without departing from the spirit and scope of the present invention, which is defined by the following claims.

I claim:

1. In a wide band signal transfer system including a wide band signal transfer channel which is subject to unwanted noise across the wide band, pre-emphasis means for increasing, prior to introduction of said signal into said channel in pre-emphasized form, the amplitude of higher-frequency wide band signal components relative to lower-frequency wide band signal components without overdriving of the transfer channel, said pre-emphasis means comprising:

input connections for receiving a signal having a wide band of frequencies within a predetermined amplitude range;

means coupled to said input connections for subjecting said wide band signal to a predetermined linear gain;

further means coupled to said input connections for subjecting said wide band signal to a non-linear gain, said non-linear gain being a direct function of the frequency and a switched function of the amplitude of the high frequency components of said wide band signal; and means coupled on their input side with said linear gain means and also with said non-linear gain means to supply at their output side a signal representing a linear combining of the input signals, said output signal being the pre-emphasized wide band signal.

2. The arrangement of claim 1, wherein said non-linear gain means comprises:

means for amplifying said wide band signal and supplying the resultant amplified signal to the input side of said combining means, said amplifying means having constant current gain over the wide band;

a network connected in shunt with the output of said amplifying means for producing a gain that is a direct function of frequency to a limit, said network comprising a parallel inductance-resistance combination; and additional means also connected in shunt with said amplifying means for switching the gain of said amplifying means for the amplitude peaks of said resultant amplified signal which exceed a predetermined magnitude, whereby the gain of said amplifying means is made a non-linear function of frequency and of the amplitude of the higher frequency components of said wide band signal.

3. The arrangement of claim 2, wherein said gain switching means comprises at least a pair of semiconductor junctions coupled back-to-back, each said junction biased to switch at predetermined amplitude levels of said resultant amplified signal.

4. The arrangement of claim 3 further including means for compensating temperature related changes in the characteristic of said semiconductor junctions, whereby the predetermined amplitude levels at which said junctions are switched is maintained independent of temperature.

5. The arrangement of claim 2, wherein said gain switching means is coupled to said amplifying means through a first resistor, whereby hard clipping of said resultant amplified signal is avoided.

6. The arrangement of claim 1 wherein said wide band signal is a video signal.

7. The arrangement of claim 1 wherein said output signal supplying means comprises a differential amplifier.

8. The arrangement of claim 1 wherein said input connections comprise a buffer amplifier.

9. The arrangement of claim 1 wherein said means for subjecting said wide band signal to a predetermined linear gain comprises a second resistor interposed in said input connections.

10. The arrangement of claim 9, further comprising means coupled in parallel with said second resistor for frequency compensating said pre-emphasizing means.

11. The arrangement of claim 10 wherein said frequency compensating means comprises a series-connected resistance-capacitance network coupled in parallel with said second resistor.

12. The arrangement of claim 1, further comprising means coupled to the end of said transfer channel for de-emphasizing said pre-emphasized signal and supplying at an output said wide band signal substantially free of distortion and of said unwanted noise.

13. The arrangement of claim 12 wherein said de-emphasizing means has a transfer characteristic complementary to that of said pre-emphasizing means.

14. The arrangement of claim 1 wherein said unwanted noise across the wide band increases in amplitude at higher frequencies.

15. In a wide band signal transfer system including a wide band signal transfer channel which is subject to unwanted noise across the wide band, pre-emphasis means for increasing, prior to introduction of said signal into said channel in pre-emphasized form, the amplitude of higher-frequency wide band signal components relative to lower-frequency wide band signal components without overdriving of the transfer channel and de-emphasis means connected to the far end of said channel for de-emphasizing the pre-emphasized wide band signal and supplying at an output said wide band signal substantially free of said unwanted noise, said de-emphasis means comprising:

input connections for receiving said pre-emphasized wide band signal;

means coupled to said input connections for subjecting the pre-emphasized wide band signal from said connections to a linear gain;

further means coupled to said input connections and including a frequency dependent gain portion comprising a series-connected resistance-capacitance network for providing a gain which is a direct function of frequency, and also including a switched gain portion passing only the peak portions of the pre-emphasized wide band signal which exceed a predetermined magnitude;

other connections for combining the signals from said linear gain means and said further means; and network means coupled to said other connections for subjecting the signal from said other connections to an inverse frequency dependent gain, and then passing said signal to said output.

16. The arrangement of claim 15 wherein said circuit connections comprise a buffer amplifier.

17. The arrangement of claim 15, wherein said linear gain means comprises a resistor.

18. The arrangement of claim 15, wherein said non-linear gain portion has a first channel for passing the peak portions of the pre-emphasized wide band signal greater than a first pre-determined level, a second channel parallel to said first channel for passing the peak portions of the pre-emphasized wide band signal less than a second predetermined level, and an output point supplying the combined peak signal portions from said first and second channels.

19. The arrangement of claim 18 wherein each said channel includes a semiconductor junction biased for passing only the respective peak portions of the pre-emphasized wide band signal.

20. The arrangement of claim 19 further including means for compensating temperature related changes in the characteristic of said semiconductor junctions, whereby the respective predetermined level of each said channel is maintained independent of temperature.

21. The arrangement of claim 15 wherein said network means comprises a resistor in parallel with a series connected resistance-capacitance network for attenuating the higher frequencies components of the signal from said other connections.

22. The arrangement of claim 15, wherein said unwanted noise across the wide band increases in amplitude at higher frequencies.

* * * * *